(12) United States Patent
Keupp et al.

(10) Patent No.: US 11,815,582 B2
(45) Date of Patent: Nov. 14, 2023

(54) DUAL ECHO STEADY STATE MR IMAGING USING BIPOLAR DIFFUSION GRADIENTS

(71) Applicant: KONINKLIJKE PHILIPS N.V., Eindhoven (NL)

(72) Inventors: Jochen Keupp, Rosengarten (DE); Ulrich Wolfgang Katscher, Norderstedt (DE)

(73) Assignee: Koninklijke Philips N.V., Eindhoven (NL)

( * ) Notice: Subject to any disclaimer, the term of this patent is extended or adjusted under 35 U.S.C. 154(b) by 39 days.

(21) Appl. No.: 17/609,422

(22) PCT Filed: May 6, 2020

(86) PCT No.: PCT/EP2020/062552
§ 371 (c)(1),
(2) Date: Nov. 8, 2021

(87) PCT Pub. No.: WO2020/225291
PCT Pub. Date: Nov. 12, 2020

(65) Prior Publication Data
US 2022/0236357 A1   Jul. 28, 2022

(30) Foreign Application Priority Data
May 9, 2019   (EP) .................................... 19173509

(51) Int. Cl.
*G01R 33/561*   (2006.01)
*G01R 33/563*   (2006.01)

(52) U.S. Cl.
CPC ... *G01R 33/5614* (2013.01); *G01R 33/56341* (2013.01)

(58) Field of Classification Search
None
See application file for complete search history.

(56) References Cited

U.S. PATENT DOCUMENTS

2004/0140803 A1   7/2004   Deimling
2012/0112743 A1*  5/2012   Granlund .......... G01R 33/5614
                                                      324/309

(Continued)

OTHER PUBLICATIONS

Gras V, Farther E, Grinberg F, Shah NJ. "Diffusion-weighted DESS protocol optimization for simultaneous mapping of the mean diffusivity, proton density and relaxation times at 3 Tesla." Magn Reson Med. Jul. 2017;78(1):130-141.

(Continued)

*Primary Examiner* — Rodney E Fuller

(57) ABSTRACT

A method of magnet resonance (MR) imaging of an object including: subjecting an object in an examination volume of an MR device to a dual echo steady state imaging sequence, a free induction decay signal (FID) and an echo signal (ECHO) being generated in each interval between two successive RF pulses, wherein a pair of diffusion gradient waveforms (GDIF) of equal phase integral and opposed polarity is applied in the interval between the FID signal and the echo signal; —acquiring the FID signals and the echo signals in a number of repetitions of the imaging sequence with varying phase encoding; and —reconstructing a diffusion weighted MR image from the acquired FID signals and echo signals.

15 Claims, 3 Drawing Sheets

(56) References Cited

U.S. PATENT DOCUMENTS

| | | | |
|---|---|---|---|
| 2012/0242334 A1* | 9/2012 | Bieri | G01R 33/5614<br>324/309 |
| 2014/0210471 A1* | 7/2014 | Stemmer | G01R 33/4835<br>324/309 |
| 2022/0308148 A1* | 9/2022 | Katscher | A61B 5/004 |

OTHER PUBLICATIONS

Miller KL, Hargreaves BA, Gold GE, Pauly JM. "Steady-state diffusion weighted imaging of in vivo knee cartilage" Magn Reson Med 2004; 51:394-398.

Bieri O, Ganter C, Scheffler K. "Quantitative in vivo diffusion imaging of cartilage using double echo steady-state free precession" Magn Reson Med 2012;68:720-729.

Scheffler K, Heid O, Hennig J. Magnetization preparation during the steady state: fat-saturated 3D TrueFISP. Magn Reson Med. Jun. 2001;45(6):1075-80.

Keupp et al "Simultaneous Aquisition of Diffusion Weighted Images and Conductivity Maps using a Balanced Double Echo Steady State (DESS) Sequence" ISMRM 2020.

Search Report and Written Opinion from PCT/EP2020/062552 dated Nov. 12, 2020.

Oliver Bieri, Fundamentals of Balanced Steady State Free Precession MRI, Journal of Magnetic Resonance Imaging, 2013 38, pp. 2-11.

Kristin L. Granlund, High-resolution, three-dimensional diffusion-weighted breast imaging using DESS, Magn Reson Imaging, 32(4), 2014, pp. 330-341.

Motion Probing Gradient : MPG, vol. 64 No. 2, 2016年, pp. 122-127 (No Translation Available).

Klaus Scheffler, Principles and applications of balanced SSFP techniques, Eur Radiol, 2003, 13, pp. 2409-2418.

\* cited by examiner

DUAL ECHO STEADY STATE MR IMAGING USING BIPOLAR DIFFUSION GRADIENTS

CROSS REFERENCE TO RELATED APPLICATIONS

This application is a U.S. national phase application of International Application No. PCT/EP2020/062552 filed on May 6, 2020, which claims the benefit of EP Application Serial No. 19173509.1 filed on May 9, 2019 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view, the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. Within the context of this specification MR device and MR imaging device are used interchangeably. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of an image reconstruction algorithm.

MR imaging is sensitive to diffusion. Known diffusion weighted imaging (DWI) techniques are commonly performed by using imaging sequences comprising diffusion gradients, wherein the diffusion of protons (of water molecules) along the direction of the diffusion gradient reduces the amplitude of the acquired MR signals.

DWI techniques are particularly vulnerable to macroscopic physiological motion in applications throughout the body, as the signal attenuation resulting from the motion can confound the measurement of interest. Subject motion during an MR examination can be particularly problematic in populations like children, the elderly, or patients with medical conditions that prevent them from lying still, such as Parkinson's disease. Motion affects the data in two main ways: shifts of the tissue to be imaged (resulting in ghosting artifacts in the reconstructed MR images), and exposure to incorrect diffusion encoding.

To avoid significant artefacts resulting from motion, DWI data have commonly been acquired using single-shot imaging sequences, such as single-shot echo-planar imaging (EPI). However, the image quality can be low and the spatial resolution is limited in single-shot DWI. The significant geometric distortions due to the echo-planar technique in combination with the main magnetic field inhomogeneity as well as limited spatial resolution make it difficult to measure diffusion properties at high precision.

While these distortions may still be acceptable or sufficiently correctable in brain applications, whole body DWI MR imaging is severely compromised. This is due to the larger scale of main magnetic field inhomogeneity effects in the body (due to tissue/air interfaces) as well as to motion effects leading to both, direct motion artefacts and dynamic changes of field inhomogeneity effects.

As a result, several other DWI techniques have been developed, some of them using steady state free precession (SSFP) imaging techniques. In general, SSFP imaging sequences are based on a gradient echo imaging sequence with a short repetition time. SSFP sequences include transverse coherences from overlapping multi-order spin echoes and stimulated echoes. This is usually accomplished by refocusing the phase-encoding gradient in each repetition interval in order to keep the phase integral (or gradient moment) constant. Fully balanced SSFP imaging sequences achieve a phase of zero by refocusing all imaging gradients. Diffusion sensitivity can be induced in SSFP imaging sequences by adding diffusion gradients. Diffusion weighted dual-echo steady-state (DW-DESS) MR imaging has been proposed as a distortion free alternative to the conventional single shot EPI approaches (see Gras V, Farrher E, Grinberg F, Shah N J, "Diffusion-weighted DESS protocol optimization for simultaneous mapping of the mean diffusivity, proton density and relaxation times at 3 Tesla", Magn Reson Med, 2017, 78(1), 130-141). DESS generates two MR signals, namely a free induction decay (FID) signal and an echo signal from the steady state free precession individually in each repetition. Phase encoding magnetic field gradients are balanced to maintain the steady state of transverse magnetization. The steady-state signals allow acquisitions with good signal to noise ratio (SNR) efficiency (comparable to EPI). As this holds for short $T_2$ relaxation, DW-DESS has been used for example in knee imaging applications (cartilage) (see Miller K L, Hargreaves B A, Gold G E, Pauly J M, "Steady-state diffusion weighted imaging of in vivo knee cartilage", Magn Reson Med 2004, 51, 394-398). The collection of two signals (FID and echo signals) provides a means to correct for relaxation weighting and further allows quantitative apparent diffusion coefficient (ADC) assessment with only two scans using different diffusion weights see (see Bieri O, Ganter C, Scheffler K, "Quantitative in vivo diffusion imaging of cartilage using double echo steady-state free precession", Magn Reson Med, 2012, 68, 720-729).

Despite the afore-mentioned advantages, DW-DESS has not become a routine sequence until today. One reason is that the full potential of signal gain in the steady state cannot be used because the gradient moments, in particular for the diffusion weighting gradients, are not balanced and, correspondingly, many signal coherence pathways get lost. Another reason is that the conventionally used unipolar diffusion gradients introduce a very strong sensitivity to bulk motion.

SUMMARY OF THE INVENTION

From the foregoing it is readily appreciated that there is a need for an improved DWI technique. It is consequently an object of the invention to enable distortion-free high-quality DWI with minimization of artefacts caused by motion.

In accordance with the invention, a method of MR imaging of an object placed in an examination volume of a MR device is disclosed. The method comprises the steps of:
  subjecting the object to a dual echo steady state imaging sequence, an FID signal and an echo signal being generated in each interval between two successive RF pulses, wherein a pair of diffusion gradient waveforms of equal phase integral and opposed polarity is applied in the interval between the FID signal and the echo signal;
  acquiring the FID signals and the echo signals in a number of repetitions of the imaging sequence with varying phase encoding; and\
  reconstructing a diffusion weighted MR image from the acquired FID signals and echo signals.

The invention proposes, in other words, a diffusion weighted dual echo steady state (DESS) sequence using bipolar diffusion gradients, in contrast to the conventionally used unipolar diffusion gradients. This enables a full balancing of gradient moments such that the different signal coherence pathways are preserved and contribute to the acquired MR signals. A maximum signal gain of the steady state sequence is obtained and thus a maximum SNR efficiency is achieved. Moreover, the bipolar diffusion gradients render the method of the invention motion insensitive. The further advantages of DW-DESS as described above are maintained.

The method of the invention uses bipolar diffusion gradients which encompasses any gradient waveform which produces no net effect on the phase of stationary spins but produces a phase difference between stationary and moving spins while the criterion of a fully balanced imaging sequence is met.

The approach of the invention has not been considered previously because sufficiently strong bipolar diffusion gradients lead to a repetition time (TR) of the imaging sequence on the order of 10 ms and more. When combined with a fully balanced steady state free precession readout, this typically leads to closely spaced dark band artefacts which would prohibit clinical use of the technique.

For (single echo) balanced SSFP, the spacing of the dark bands depends only on the repetition time TR and on field inhomogeneity induced off-resonances. The dark bands of the FID and echo signals in fully balanced DW-DESS also depend on the moments of the diffusion gradients which cause an additional off-resonance effect in the gradient direction. It is an insight of the invention that the orientation and spacing of the dark bands is strongly dominated by the diffusion gradients at high gradient moments while actual off-resonances play only a minor role. This is exploited in a preferred embodiment of the invention by choosing the zeroth moments of the individual diffusion weighting gradient waveforms such that the spatial distance of dark band artefacts is smaller than the voxel size in the reconstructed diffusion weighted MR image. The zeroth moment is equal to the area under the gradient waveform as a function of time. By sufficiently high zeroth gradient moments of the diffusion gradient waveforms the spatial distance of the dark band artefacts can be reduced to a value smaller than the imaging voxel size. Dark bands within a voxel may partly reduce the overall signal intensity but are not visible as artefacts. Hence, a strong diffusion weighting can be induced at a high SNR efficiency by combining all coherence pathways for the overall FID and echo signals of the DESS acquisition.

The diffusion weighting imposed on the FID and echo signals is exploited according to the invention to reconstruct a diffusion weighted MR image. In a preferred embodiment, the reconstruction of the MR image involves derivation of diffusion coefficients. The acquisition of the FID signals and echo signals is preferably repeated two or more times with different diffusion gradient waveforms (in different spatial directions and/or with different gradient moments) being applied in the different repetitions. The image may be a fractional anisotropy (FA) map, a mean diffusivity (MD) map, a radial diffusivity (RD) map or an axial diffusivity (AD) map, as commonly used in clinical studies, or a map of any other scalar metric derived from the diffusion weighting. For example, the reconstruction of the diffusion weighted MR image may simply involve computing the ratio of a first MR image reconstructed from the FID signals and a second MR image reconstructed from the echo signals. Moreover, the reconstruction of the diffusion weighted MR image may involve derivation of a map of apparent diffusion coefficients (ADC) from the acquired FID signals and echo signals as proposed by Bieri et al. (see reference cited above).

In a preferred embodiment of the invention, the gradient moment is maximized by applying the diffusion gradients in all spatial directions simultaneously. The capacities of the gradient system of the used MR device can be optimally made use of in this way.

In a further preferred embodiment of the invention, the FID signals and the echo signals are acquired with opposed readout gradients. In this embodiment, the gradient is switched between opposed directions in the readout direction throughout the interval between two successive RF pulses.

The method of the invention described thus far can be carried out by means of a MR device including at least one main magnet coil for generating a uniform static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device According to further aspects the invention is an MR device including at least one main magnet coil (2) for generating a uniform, static magnetic field within an examination volume, a number of gradient coils (4, 5, 6) for generating switched magnetic field gradients in different spatial directions within the examination volume, at least one RF coil (9) for generating RF pulses within the examination volume and/or for receiving MR signals from an object (10) positioned in the examination volume, a control unit (15) for controlling the temporal succession of RF pulses and switched magnetic field gradients, and a reconstruction unit (17), wherein the MR device (1) is arranged to perform the following steps
    subjecting the object (10) to a dual echo steady state imaging sequence, a free induction decay signal (FID) and an echo signal (ECHO) being generated in each interval between two successive RF pulses, wherein a pair of diffusion gradient waveforms (GDIF) of equal phase integral and opposed polarity is applied in the interval between the FID signal and the echo signal;
    acquiring the FID signals and the echo signals in a number of repetitions of the imaging sequence with varying phase encoding; and
    reconstructing a diffusion weighted MR image from the acquired FID signals and echo signals.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
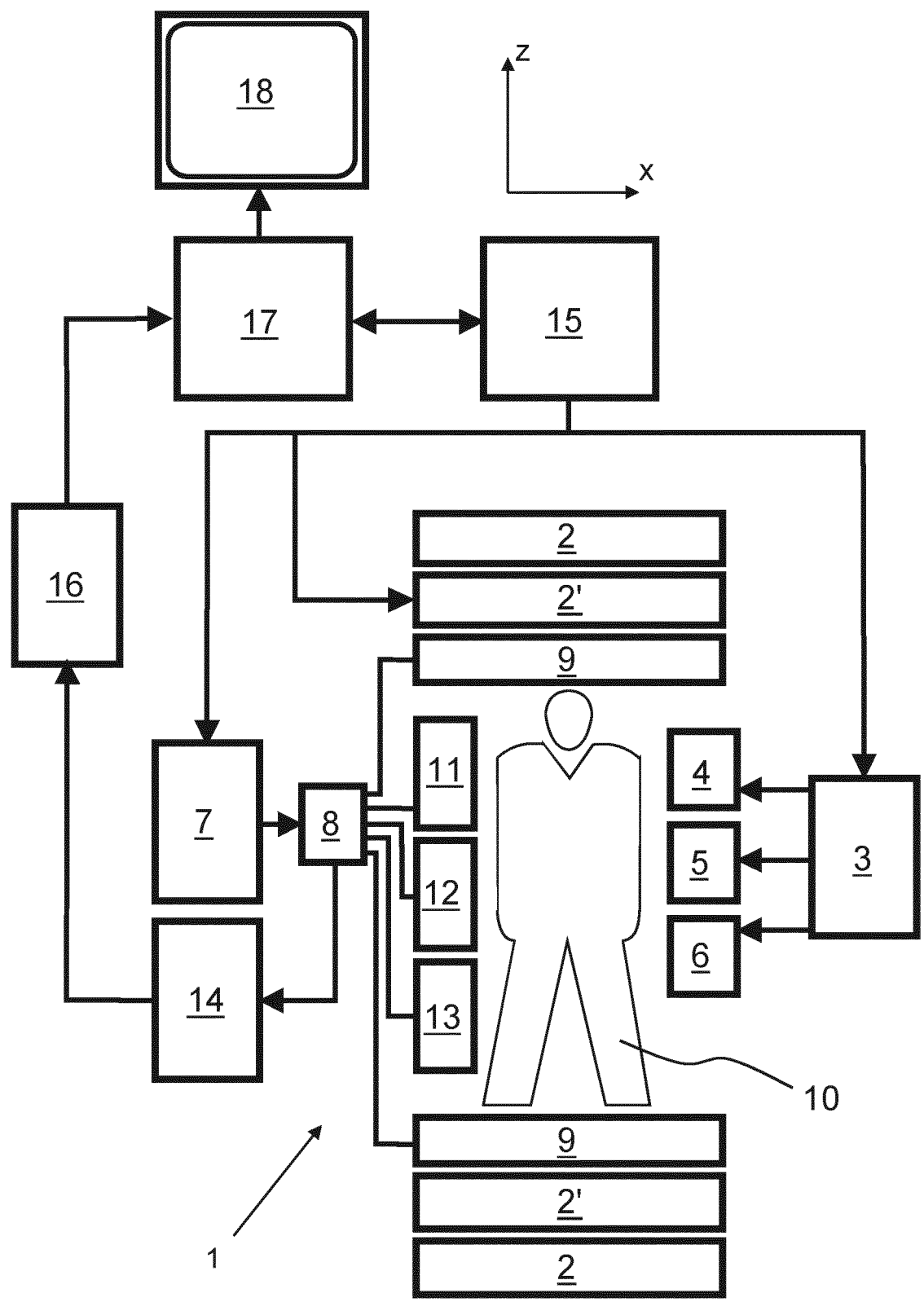
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the whole-body volume RF coil 9.

For generation of MR images of limited regions of the body 10, a set of local array RF coils 11, 12, 13 are placed contiguous to the region selected for imaging. The array coils 11, 12, 13 can be used to receive MR signals induced by body-coil RF transmissions.

The resultant MR signals are picked up by the whole body volume RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as a diffusion weighted dual echo steady state (DW-DESS) imaging sequence or the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such as SENSE, SMASH, or GRAPPA. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

With continuing reference to FIG. 1 and with further reference to FIGS. 2-5 embodiments of the method of the invention are explained in the following.

Figure 2:
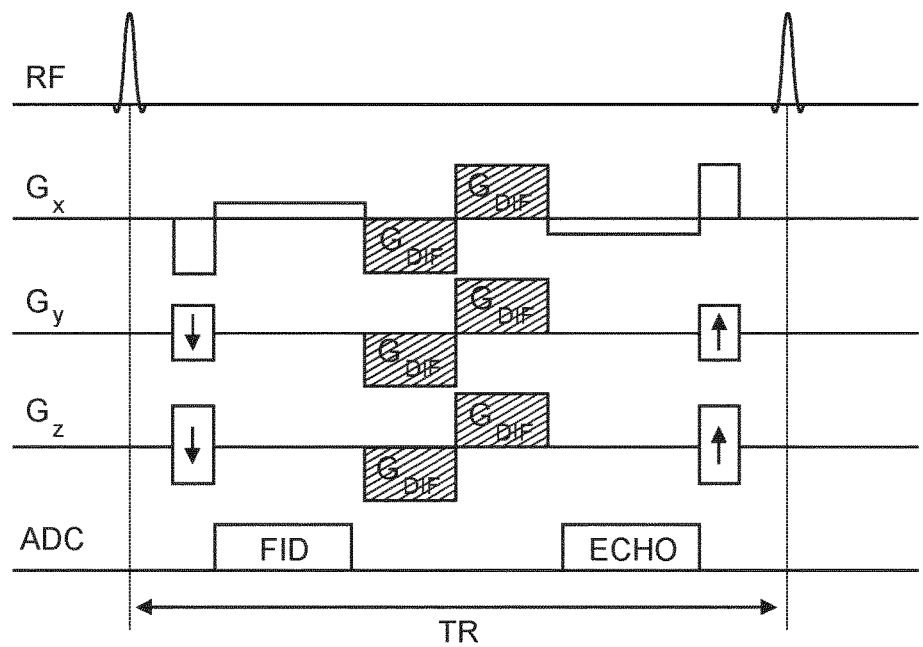
FIG. 2 shows a diagram of an imaging sequence used in an embodiment of the invention.
Figure 3:
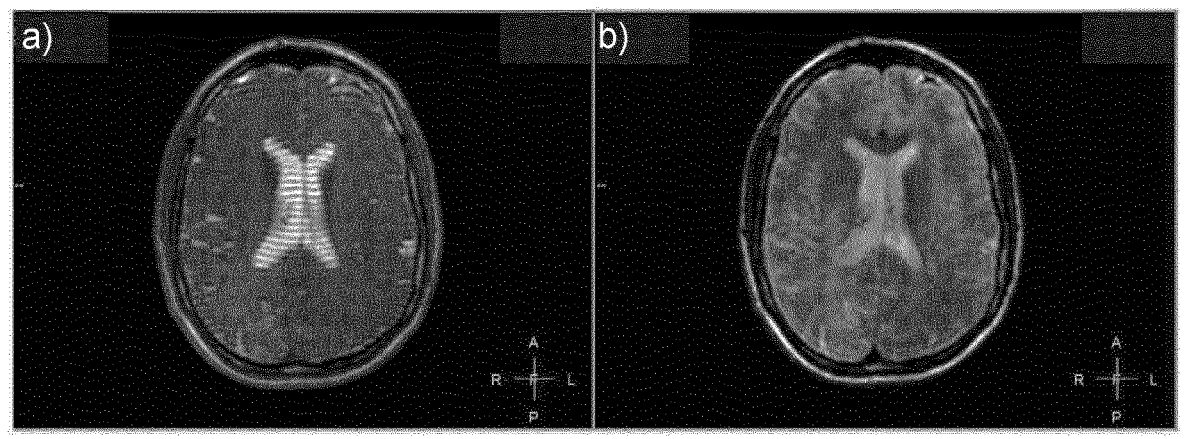
FIG. 3 shows a DW-DESS brain image acquired with different diffusion gradient moments.

The body 10 is subjected to multiple repetitions of a diffusion weighted steady state imaging sequence as illustrated in FIG. 2. The sequence is a modified fully balanced DESS sequence in which the two acquisitions (indicated by ADC) FID and ECHO of the free induction decay and echo signals respectively are separated by a pair of diffusion gradient waveforms $G_{DIF}$ of equal phase integral and opposed polarity, i.e. bipolar trapezoidal diffusion gradients with equal magnitude in the depicted embodiment. The FID and ECHO acquisitions are performed with opposed readout gradients $G_X$. Both readouts are combined with pre-phasing and re-phasing gradients for a fully balanced readout. The phase encoding gradients in the $G_Y$ and $G_Z$ directions are fully balanced as well. For a maximum diffusion weighting, all gradient directions $G_x$, $G_y$, $G_z$ are simultaneously used for generating the bipolar diffusion gradients.

As explained in detail above, dark band artefacts of the FID and echo signals occur in fully balanced DW-DESS if insufficient moments of the diffusion gradients are used. The orientation and spacing of the dark bands is strongly dominated by the diffusion gradients, in particular at high gradient moments. FIG. 3a shows a DW-DESS brain image acquired with insufficient gradient moments. The typical dark band artefacts can be seen. In FIG. 3b, the diffusion gradients are chosen according to the invention to be so strong that the spatial distance of the dark bands is smaller than the voxel size. The dark bands within each voxel partly reduce the overall signal intensity but are no longer visible as artefacts. Applications of the invention exist in all areas of diffusion weighted MR imaging, in the brain but also in particular in the body, where magnetic field inhomogeneity may lead to large geometrical distortion or even signal cancellation in conventional DWI based on EPI acquisitions. Particularly for whole body applications, the invention may be combined with fat-saturated (or water only) bSSFP/TrueFISP techniques (see Scheffler K, Heid O, Hennig J, "Magnetization preparation during the steady state: fat-saturated 3D TrueFISP", Magn Reson Med, 2001, 45(6), 1075-80), in order to reduce the high signal level from fat containing tissues.

Figure 4:
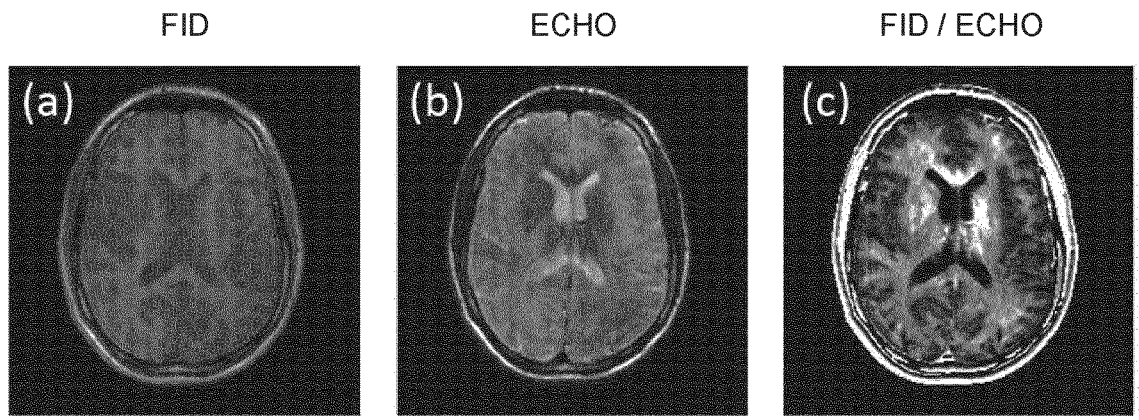
FIG. 4 illustrates the reconstruction of a DW-DESS brain image according to the invention.

FIG. 4 shows a further brain imaging example (repetition time TR=30 ms). The two FID and ECHO signals in FIGS. 4a and 4b show a different degree of diffusion weighting because the coherence paths for the FID and ECHO signals are differently influenced by the diffusion gradients. In FIG. 4c, the ratio FID/ECHO is calculated for each voxel highlighting the differences in diffusion weighting.

Figure 5:
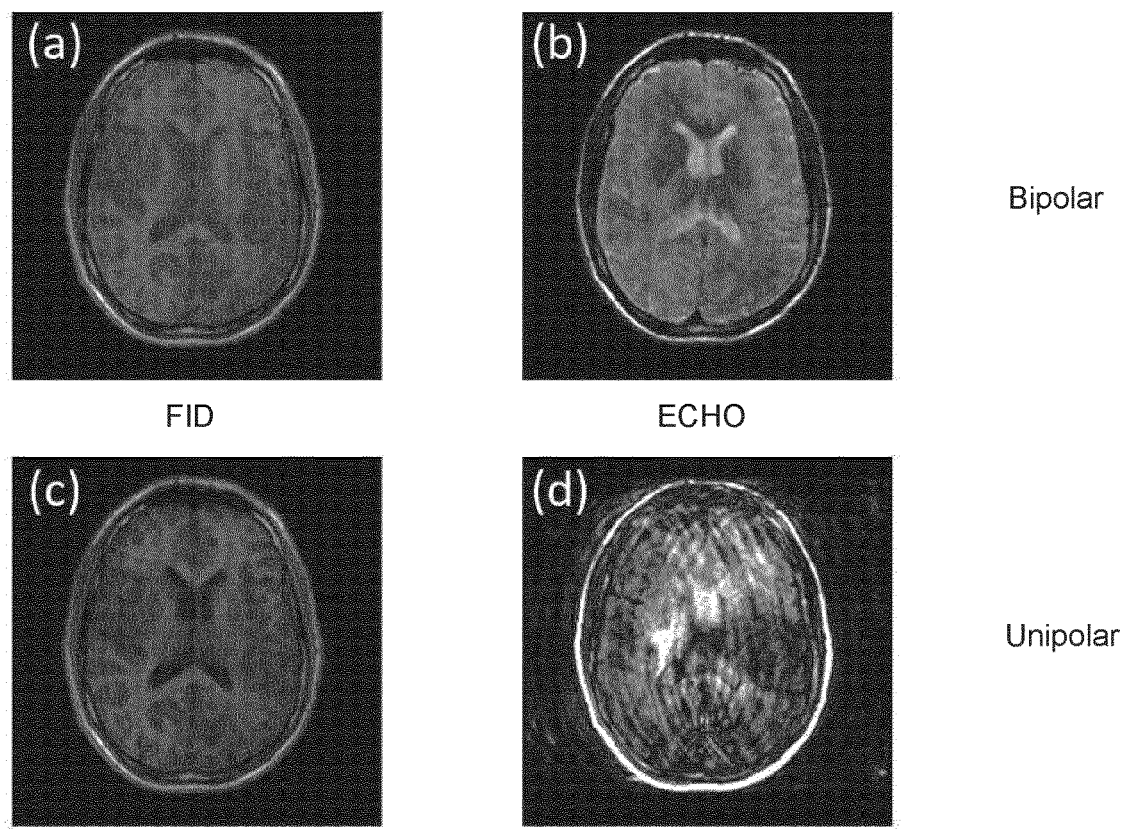
FIG. 5 shows DW-DESS brain images acquired with bipolar and unipolar diffusion gradients.

The diffusion weighted fully balanced DESS technique of the invention is particularly robust with regard to motion, as can be seen in FIG. 5. FIG. 5 compares DW-DESS imaging using bipolar diffusion gradients (FIGS. 5a, 5b) and unipolar diffusion gradients (FIGS. 5c, 5d). While the bipolar variant according to the invention provides stable image quality for both signals FID and ECHO, the ECHO signal is clearly corrupted by bulk motion during the approx. three minutes of acquisition time in FIG. 5d.

Further, a combined acquisition of distortion-free diffusion-weighted images and tissue conductivity maps is provided using a fully balanced double echo steady state (DESS) sequence. Banding artifacts are avoided using sufficiently high gradient moments of the diffusion gradient, such that the banding is contained within single voxels. The stability of the B1 transceive phase measurement by the balanced DESS sequence allows the derivation of quantitative tissue conductivity based second derivative using standard EPT (electrical properties tomography) methods. Feasibility of simultaneous DWI and EPT is shown on a 3T MM system in phantom and volunteer experiments (head).

Diffusivity and tissue conductivity are physiologic parameters with manifold applications e.g. in tumor characterization, typically assessed by Diffusion Weighted Imaging (DWI) and Electrical Properties Tomography (EPT) in separate sequences. EPI based DWI sequences often suffer from geometric distortions (magnetic field inhomogeneity). Diffusion weighted dual-echo steady-state (DWDESS) MRI using unipolar gradients provides a distortion free alternative, but is inherently sensitive to motion and does not exploit the steady-state signal, because of non-balanced gradients. In this study, a balanced DW-DESS sequence was developed using bipolar DW gradients while avoiding dark-band artefacts. EPT is based on the transceive phase φ purely related to B1 (not impacted by B0) as in spin-echo (SE) based sequences as well as in balanced steady state sequences. The use of φ from balanced DW-DESS as basis for EPT is investigated. This would synergistically allow to assess two relevant physiological parameters from a single MR acquisition.

A fully-balanced DW-DESS sequence is used in combination with bipolar DW gradients.

For (single echo) balanced SSFP, the dark band spacing only depends on TR and off-resonances (frequency spacing 1/TR), as the echo is fully refocused at TE=TR/2. The dark-bands of S+ and S− in fully-balanced DESS also depend on the moments of the diffusion weighting gradient lobes, which appear as an additional off-resonance effect in the gradient direction. At high gradient moments, the orientation and spacing of the dark bands is dominated by the gradient effect and less influenced by actual off-resonances. This study applies sufficiently high gradient moments of the bipolar gradient lobes such that the spatial distance of the dark band artefacts is reduced to a value smaller than the imaging voxel size. Dark bands within a voxel partly reduce the overall signal intensity but are not visible as artefacts. Thus, a strong diffusion weighting can be induced at high SNR efficiency by combining all coherence pathways for the overall FID (echo1, S+) and ECHO (echo2, S−) of the DESS acquisition.

From the acquired DESS signals, conductivity σ was calculated via $$\sigma = \nabla^2 \varphi / 2\mu\omega$$

(with vacuum permeability μ and Larmor frequency ω) in combination with a bilateral denoising filter. A phantom was composed of polyvinylpyrolidon (P), gelatine (G), NaCl (S) and H2O (W) with different diffusion and conductivity values in an outer and inner compartment (inner: D=1.04×10 mm/s, σ=0.66 S/m, P/G/S/W=5/3/0.5/91.5 mass %; outer: D=0.8×10 mm/s, σ=0.42 S/m, P/G/S/W=25/3/0.3/71.7 m %).

Combined DW-DESS and EPT acquisition was tested on a 3T MRI system (Achieva TX, Philips, NL) on the phantom and in a volunteer head examination (male, age 50 yrs), with written consent obtained, using the following imaging parameters: 3D balanced dual-echo SSFP, 8-channel head coil, TR/TE/TE=31/1.8/26 ms (phantom: 53/1.85/50.8 ms), FOV 224×224×120 mm, pixel 1.8×1.8 mm, reconstruction 224×224, 24 slices (5 mm in vivo, 1.8 mm phantom), pixel bandwidth 1.3 kHz, bipolar or unipolar diffusion gradients (3 simultaneous directions, duration 2×11 ms (phantom: 2×22 ms), slopes 0.4 ms, strength 18 mT/m), two signal averages (phantom: 6), total scan duration 2 min 55 s (phantom: 7 min). Diffusion weighted images were computed as ratio S+/S−.

Phantom results confirm that the diffusion weighting can be compared with and ADC map obtained using a standard DWI sequence (EPI, 8 b-values 0 . . . 1400, FIG. 2d). The conductivity map obtained from S+ and the measured σ values, inner/outer=(0.77±0.02)/(0.31±0.06) S/m, correspond to the phantom preparation.

A balanced DW-DESS acquisition could be successfully implemented using large bipolar DW gradients that avoid banding artifacts and show low motion sensitivity. Although the SNR is lowered by dark band contents within the voxels, image quality was clearly improved as compared to unipolar gradients. A drawback of bipolar DW-DESS is given by its limitation of the achievable b-values. In this initial demonstration, the diffusion weighted images also include a considerable T2 weighting, because of the long second echo time (26 or 51 ms). Multiple b-values with the same echo time could be used to reduce the T2 weighting (b=0 cannot be used because of banding artifacts). The transceive phase of DW-DESS can be used for EPT, yielding conductivity maps with comparable quality as previously obtained in the brain. Because of the lower overall SNR in S− images (DW and long TE), EPT reconstructions were preferably calculated from the first echo S+.

DW-DESS is able to produce distortion-free diffusion weighted images and conductivity maps simultaneously. It is thus expected to be a valuable sequence particularly for tumor characterization.

The invention claimed is:

1. A method of magnetic resonance (MR) imaging of an object placed in an examination volume of a MR device, the method comprising:
   subjecting the object to a dual echo steady state imaging sequence, a free induction decay (FID) signal and an echo signal (ECHO) being generated in each interval between two successive RF pulses, wherein a pair of diffusion gradient waveforms (GDIF) of equal phase integral and opposed polarity is applied in the interval between the FID signal and the echo signal;
   acquiring the FID signals and the echo signals in a number of repetitions of the imaging sequence with varying phase encoding; and
   reconstructing a diffusion weighted MR image from the acquired FID signals and echo signals,
   wherein the dual echo steady state imaging sequence is fully balanced, and
   wherein zeroth moments of associated diffusion gradients are chosen such that the spatial distance of dark band artefacts is smaller than the voxel size in the reconstructed diffusion weighted MR image, and
   wherein the FID signals and the echo signals are acquired with opposed readout gradients.

2. The method of claim 1, wherein the diffusion gradients are applied in all spatial directions simultaneously.

3. The method of claim 1, wherein the FID signals and the echo signals are acquired with opposed readout gradients.

4. The method of claim 1, wherein the reconstruction of the diffusion weighted MR image involves computing a ratio of a first MR image reconstructed from the FID signals and a second MR image reconstructed from the echo signals.

5. The method of claim 1, wherein the reconstruction of the diffusion weighted MR image involves derivation of a map of apparent diffusion coefficients from the acquired FID signals and echo signals.

6. The method of claim 1, wherein the reconstruction of the MR image involves derivation of diffusion coefficients.

7. The methods of claim 1, wherein the acquisition of the FID signals and echo signals is repeated two or more times with different diffusion gradient waveforms being applied in the different repetitions.

8. The method of claim 1, further comprising the step of reconstructing a conductivity image from phase information obtained from the acquired FID and/or echo signal.

9. A magnetic resonance (MR) imaging device including at least one main magnet coil for generating a uniform, static magnetic field within an examination volume, a number of gradient coils for generating switched magnetic field gradients in different spatial directions within the examination volume, wherein the MR device is arranged to perform the following steps
   subjecting the object to a dual echo steady state imaging sequence, a free induction decay (FID) signal and an echo signal (ECHO) being generated in each interval between two successive RF pulses, wherein a pair of diffusion gradient waveforms (GDIF) of equal phase integral and opposed polarity is applied in the interval between the FID signal and the echo signal;
   acquiring the FID signals and the echo signals in a number of repetitions of the imaging sequence with varying phase encoding; and
   reconstructing a diffusion weighted MR image from the acquired FID signals and echo signals,
   wherein dual echo steady state imaging sequence is fully balanced, and
   wherein the MR imaging device is arranged to operate all gradient coils simultaneously during application of the diffusion gradients such that zeroth moments of associated diffusion gradient waveforms suffices to reduce the spatial distance of dark band artefacts below the voxel size of the reconstructed diffusion weighted MR image, and
   wherein the MR imaging device is arranged to acquire FID signals and the echo signals with opposed readout gradients.

10. A computer program including executable instructions stored on a non-transitory computer readable medium, which when run on a magnetic resonance (MR) device performs a method comprising:
   generating a dual echo steady state imaging sequence, wherein a pair of diffusion gradient waveforms (GDIF) of equal phase integral and opposed polarity is applied in the interval between a free induction decay (FID) signal and an echo signal (ECHO);
   acquiring the FID signals and the echo signals in a number of repetitions of the imaging sequence with varying phase encoding; and
   reconstructing a diffusion weighted MR image from the acquired FID signals and echo signals
   wherein the dual echo steady state imaging sequence is fully balanced, and
   wherein zeroth moments of associated diffusion gradients are chosen such that the spatial distance of dark band artefacts is smaller than the voxel size in the reconstructed diffusion weighted MR image, and
   wherein the FID signals and the echo signals are acquired with opposed readout gradients.

11. The computer program of claim 10, wherein the diffusion gradients are applied in all spatial directions simultaneously.

12. The computer program of claim 10, wherein the FID signals and the echo signals are acquired with opposed readout gradients.

13. The computer program of claim 10, wherein the reconstruction of the diffusion weighted MR image involves computing the a ratio of a first MR image reconstructed from the FID signals and a second MR image reconstructed from the echo signals.

14. The computer program of claim 10, wherein the reconstruction of the diffusion weighted MR image involves derivation of a map of apparent diffusion coefficients from the acquired FID signals and echo signals.

15. The computer program of claim 10, wherein the reconstruction of the MR image involves derivation of diffusion coefficients.

* * * * *